(12) United States Patent
Nilsson et al.

(10) Patent No.: US 6,856,194 B2
(45) Date of Patent: Feb. 15, 2005

(54) CENTER OF GRAVITY COMPENSATION OF CLASS-D AMPLIFIER

(75) Inventors: Johan Nilsson, Lund (SE); Lars Lennartsson, Veberöd (SE); Horst Knoedgen, München (DE)

(73) Assignee: Dialog Semiconductor GmbH, Kirchheim/Tech-Nabern (DE)

( * ) Notice: Subject to any disclaimer, the term of this patent is extended or adjusted under 35 U.S.C. 154(b) by 0 days.

(21) Appl. No.: 10/350,836

(22) Filed: Jan. 24, 2003

(65) Prior Publication Data

US 2004/0113684 A1 Jun. 17, 2004

(30) Foreign Application Priority Data

Dec. 11, 2002 (EP) ............................................. 02392022

(51) Int. Cl.⁷ .............................. H03F 3/38; H03F 3/217
(52) U.S. Cl. ...................... 330/10; 330/207 A; 330/251
(58) Field of Search ................................ 330/10, 207 A, 330/251

(56) References Cited

U.S. PATENT DOCUMENTS

| | | | |
|---|---|---|---|
| 4,603,425 A | * 7/1986 | Berlinsky et al. | ............ 375/238 |
| 5,438,694 A | 8/1995 | Muri et al. | ................. 455/341 |
| 5,617,058 A | 4/1997 | Adrian et al. | ................. 330/10 |
| 5,847,602 A | 12/1998 | Su | .............................. 330/10 |
| 5,917,369 A | * 6/1999 | Nguyen | ........................ 330/10 |
| 5,949,282 A | 9/1999 | Nguyen et al. | ................ 330/10 |
| 5,974,089 A | 10/1999 | Tripathi et al. | ............. 375/247 |
| 6,344,811 B1 | 2/2002 | Melanson | ..................... 341/143 |
| 6,404,280 B1 | 6/2002 | Jeng | .............................. 330/10 |
| 6,466,087 B2 | * 10/2002 | Ruha | ........................... 330/10 |

FOREIGN PATENT DOCUMENTS

| | | | | |
|---|---|---|---|---|
| EP | 11 04094 A1 | 5/2001 | ........... | H03F/3/217 |
| WO | WO 98/44626 | 10/1998 | ........... | H03F/3/217 |

OTHER PUBLICATIONS

U.S. Appl. No. DS–02–012, "Linearization of a PDM Class–D Amplifier," U.S. Appl. No. 10/336,967, filed Jan. 6, 2003, assigned to the same assignee.

U.S. Appl. No. DS–02–014, "Multi–level Class D Amplifier by Means of 3 Physical Levels," U.S. Appl. No. 10/304,784, filed Nov. 26, 2002, assigned to the same assignee.

* cited by examiner

*Primary Examiner*—Patricia Nguyen
(74) *Attorney, Agent, or Firm*—George D. Salle; Stephen B. Ackerman

(57) ABSTRACT

In a Class-D Amplifier with PCM (Pulse Code Modulated) input signal, the output pulse width may be adjusted to provide a constant time-voltage-area or the output pulse width may have one of several discrete values to provide a multi-level output system. A fundamental idea of this disclosure is to assure the center of each output pulse is always positioned at the nominal clock or with a fixed delay relative to the nominal clock. Said Class-D Amplifier typically converts the input signal into PDM (Pulse Density Modulated) pulses with a Sigma Delta Modulator and typically drives the output load with an H-Bridge.

45 Claims, 5 Drawing Sheets

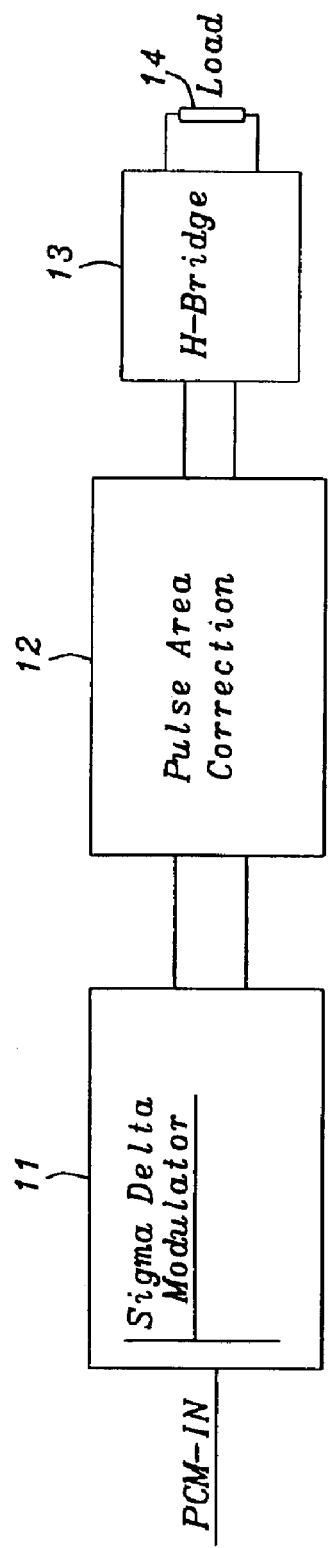
FIG. 1 – Prior Art
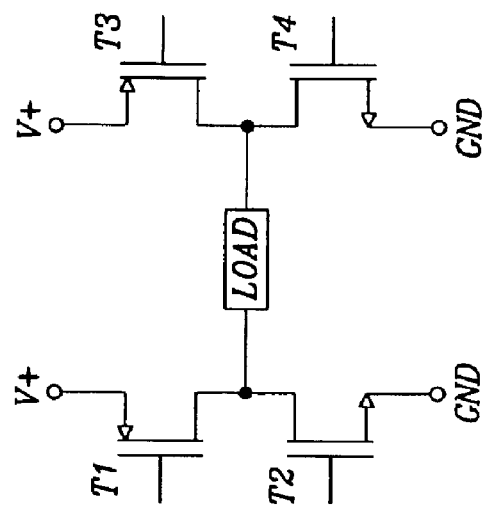
FIG. 2 – Prior Art

CENTER OF GRAVITY COMPENSATION OF CLASS-D AMPLIFIER

RELATED PATENT APPLICATION

This application is related to U.S. patent application Ser. No. 10/336,967, filed on Jan. 6, 2003 and DS02-014, Ser. No. 10/304,784, filed on Nov. 26, 2002, and assigned to the same assignee as the present invention.

BACKGROUND OF THE INVENTION (1) Field of the Invention

The invention relates to a Class-D Power Amplifier, and more particularly, to a Class-D Power Amplifier having a pulse coded digital input signal and typically using an H-Bridge to drive an output load, like a loudspeaker.

(2) Description of the Prior Art

Class-AB amplifiers are notoriously inefficient and Class-D amplifiers overcome this shortfall. With Class D amplifiers, the output is made to switch between the two output levels at a very high frequency—substantially higher than the highest audible frequency, which is done by feeding high-frequency pulses to the power amplification stage. The pulse-width ratio or the pulse density of the driving signal can be varied to make the averaged (filtered) output signal follow the (amplified) input signal very closely; such amplifier is referred to as pulse width modulated (PWM) or as pulse density modulated (PDM). The filtered output voltage at the load represents the input signal correct as long as the supply voltage is perfectly constant, which however is not true in real life.

To overcome the problem of supply voltage fluctuations, a specific technique might be implemented to always keep the time-voltage area of each pulse constant. However due to such pulse time correction, the center of each pulse will then no longer be repeated with the intended clock rate and the resulting jitter introduces noise and spuriouses.

Another area, where the center of each pulse will not be repeated with the intended clock rate, is an amplifier, where the output pulse width may have one of several discrete values to provide a multi-level output system.

Specifically, Patent Disclosure DS02-012, "Linearization of a PDM Class-D Amplifier", to which this disclosure relates, describes the invention to such Pulse Area Correction Mechanism. Also, Patent Disclosure DS02-014, "Multi-level Class D amplifier by means of 3 physical levels." to which this disclosure relates, describes the invention of an amplifier, where the output pulse width may have one of several discrete values to provide a multi-level output system FIG. 1 prior art shows a schematic block diagram of a PDM Class-D Amplifier with a Pulse Area Correction Mechanism inserted into the signal path. It typically comprises a Sigma Delta Modulator converter, to generate the driving pulses and it comprises a power output stage, which is typically an H-Bridge.

FIG. 2 prior art shows a simplified diagram of an H-Bridge.

U.S. Pat. No. (5,949,282 to Nguyen, Huey, Takagishi, Hideto) describes circuit for, first, generating an accurate reproduction of the output of a Class D amplifier for error-correction purposes, and then, second, comparing this reference signal to the original signal input to the amplifier for error-correcting purposes.

U.S. Pat. No. (5,847,602 to Su, David) shows a delta-modulated magnitude amplifier which is used to amplify the magnitude component of an RF power amplifier that employs envelope elimination and restoration. The delta-modulated amplifier introduces a smaller amount of non-linearity than traditional approaches, which are based upon pulse-width modulation. The disclosed technique can be implemented using switched-capacitor circuits in a standard MOS technology with only two external components, i.e., an inductor and a capacitor. Thus, the disclosed technique allows the implementation of an efficient and yet linear RF power amplifier using low-cost MOS technology.

U.S. Pat. No. (5,974,089 Tripathi, et al) describes an oversampled, noise shaping signal processor having at least one integrator stage in a feedback loop. A sampling stage in the feedback loop is coupled to the at least one integrator stage. The sampling stage samples an analog signal at a sample frequency. Qualification logic coupled to the sampling stage receives a pulse waveform therefrom, and ensures that signal transitions in the pulse waveform occur more than a first time period apart and that the waveform can therefore be handled by, for example, a power switching device. A switching stage in the feedback loop is coupled to the qualification logic. The signal processor has a feedback path from the output of the switching stage to the input of the at least one integrator stage thereby closing the feedback loop.

SUMMARY OF THE INVENTION

A Class-D Amplifier typically converts the input signal into PDM (Pulse Density Modulated) pulses with a Sigma Delta Modulator and typically drives the output load with an H-Bridge.

A principal object of the invention is to assure, each pulse driving a Class-D amplifier is applied with the center of the pulse at its nominal clock position or with a constant delay relative to said nominal clock position. If, for example, to compensate for the supply voltage fluctuations, the pulse length is extended to achieve a constant time-voltage area, the center of each pulse will no longer be produced at the intended clock position and the resulting jitter introduces noise and spuriouses. Another example is an amplifier, where the output pulse width may have one of several discrete values to provide a multi-level output system.

A fundamental idea is to determine the delay required to move the center of the pulse to the originally defined clock position or to move it to a point with fixed delay relative to said originally defined clock position. Therefore a correction of a pulse position always involves a correction of both the leading edge and of the trailing edge of a pulse.

In accordance with the objectives of this invention a circuit to assure, each pulse driving a Class-D amplifier is applied with the center of the pulse at its nominal clock position or with a constant delay or hold-back time relative to its nominal clock position is achieved. The circuit comprises means to convert the input signal into PDM (Pulse Density Modulated)control pulses. The circuit either comprises the means to correct the time-voltage-area, depending on a voltage representing the actual voltage across the output load or it comprises the means to generate pulses with various discrete time-voltage-area values, depending on a pulse length control signal. Further it comprises means to define said value, representing the actual voltage across the output load as well as means to define the output pulse area reference. Key element of this invention are the means to determine the required delay to shift the power driver control pulses start point, making sure each pulse is applied with the center of the pulse at said nominal clock position.

In addition the circuit consists of the means to generate the corrected power driver control pulses. Finally the circuit consists of the means for a power driver, said H-Bridge, to drive voltage into an output load, controlled by said power driver control pulses and the means for an output.

In accordance with the objectives of this invention, method is to assure the center of each output pulse of said Class-D Amplifier is always positioned at its nominal clock or with a fixed delay relative to its nominal clock is achieved. First it converts said input signal into PDM (Pulse Density Modulated) control pulses. Then it either corrects the time-voltage-area, depending on a voltage representing the actual voltage across the output load, or it generates pulses with various discrete time-voltage-area values, depending on a pulse length control signal. Further it defines a value representing the actual voltage across the output load. The key-method determines the required delay to shift the power driver control pulses start point, making sure each pulse is applied with the center of the pulse at said nominal clock position. It then generates said power driver control pulses with their shifted center of gravity. Finally it applies said power driver control pulses to said power driver.

BRIEF DESCRIPTION OF THE DRAWINGS

In the accompanying drawings, forming a material part of this description, there is shown:

FIG. 1 (Prior Art) shows a schematic block diagram of a PDM Class-D Amplifier with a Pulse Area Correction Mechanism inserted into the signal path.

FIG. 2 (Prior Art) shows a principal circuit of an H-Bridge.

DESCRIPTION OF THE PREFERRED EMBODIMENTS

Figure 3:
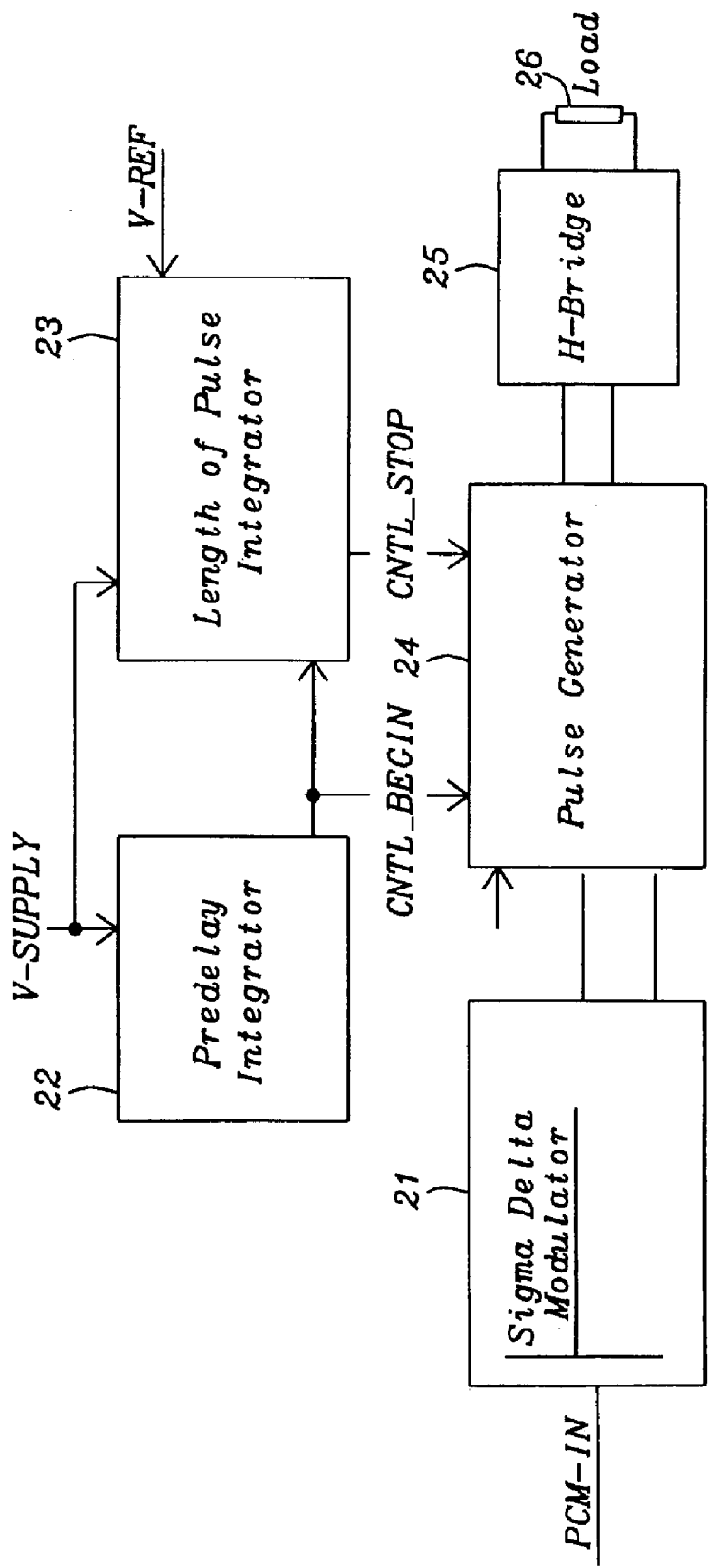
FIG. 3 shows the schematic block diagram for a solution, in accordance with an embodiment of this invention.

A schematic block diagram of the circuit as disclosed in this invention is shown in FIG. 3.

A Pulse Density Modulated (PDM) based Class-D Amplifier typically uses a Sigma Delta Modulator (21) to convert the input signal into PDM pulses to drive the Class-D power output stage. Typically this power output stage is an H-Bridge (25).

A principal object of the invention is to assure, each pulse driving a Class-d amplifier is applied with the center of the pulse at its nominal clock position or with a constant delay or hold-back time relative to said nominal clock position.

If, for example, to compensate for the supply voltage fluctuations, the pulse length is corrected to achieve a constant time-voltage area, the center of each pulse will no longer be repeated with the intended clock rate and the resulting jitter introduces noise and spuriouses. Another example is an amplifier, where the output pulse width may have one of several discrete values to provide a multi-level output system A fundamental idea is to determine the delay required to move the center of the pulse to the originally defined clock position or to move it to a point with fixed delay relative to said originally defined clock position Therefore a correction of a pulse position always involves a correction of both the leading edge and of the trailing edge of a pulse.

The "Predelay Integrator" (22), which is onekey element of this invention, takes the actual supply voltage and starts integrating it. The output pulse starts when the integrator value reaches a reference value. This reference value is a function of the supply voltage. integrator value reaches a reference value. This reference value is a function of the supply voltage.

The "Length-of-Pulse Integrator" (23) Function takes the actual supply voltage and starts integrating it, beginning when the pre-delay ends. When the criteria to end the pulse is met, the integration stops the output signal pulse.

In accordance with the objectives of this invention, said circuit comprises a unit to convert the input signal into PDM (Pulse Density Modulated) time control pulses, typically a Sigma Delta Modulator. The circuit also comprises a "Pulse Generator Unit" (24), inserted into the signal path between said converter for PCM signals and the output power stage, which is, as said before, typically an H-Bridge (25). Said H-Bridge drives voltage into said output load (26), like a loudspeaker.

The key element of this invention is said "Predelay Integrator" (22), which comprises an integrator for a signal, representing the actual voltage across the output load and a unit to determine the proper reference level. Further it comprises a logic function to decide on the optimum pulse delay, providing the correct start signal for the output pulse, which it feeds into said "Pulse Generator Unit".

Figure 4A:
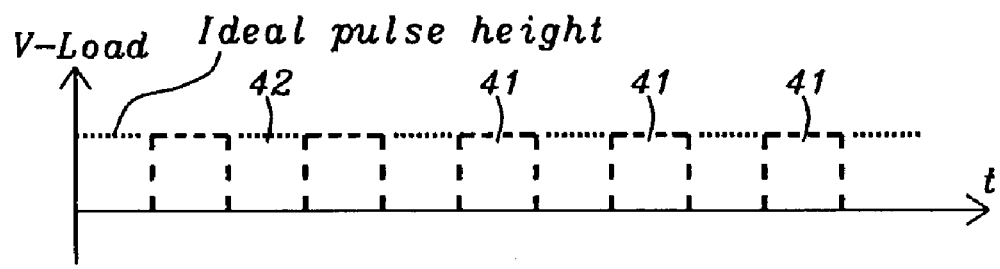
FIGS. 4a, 4b and 4c show the relationship of ideal pulses, pulses with corrected pulse area and pulses with corrected pulse center position.

FIG. 4a shows ideal pulses 41 under the condition of constant supply voltage. Said ideal pulses are drawn with dotted lines. The gray line represents the ideally constant load voltage 42.

Figure 4B:
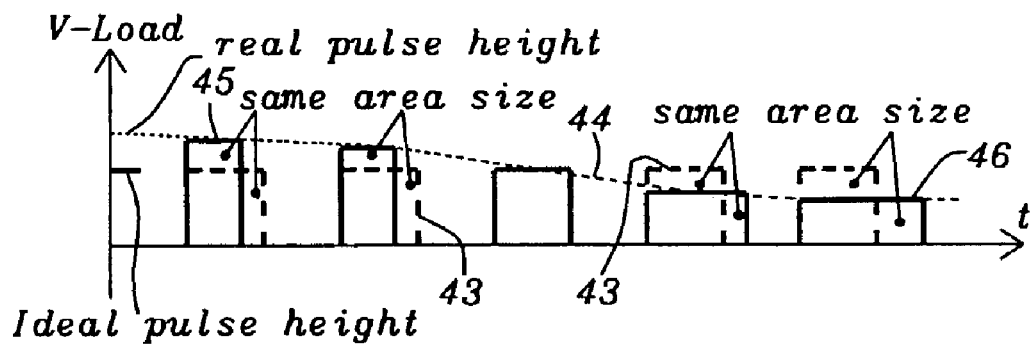

FIG. 4b shows the relation of the original real pulses and the corrected pulses under the condition of supply voltage variation. The ideal pulses of FIG. 4a are shown again as reference with dotted lines 43. The gray line now represents the varying load voltage 44 under actual conditions. If the voltage over the load is high, the pulses 45 must be shorter, however if the voltage over the load is low, the pulses 46 must be longer.

Figure 4C:
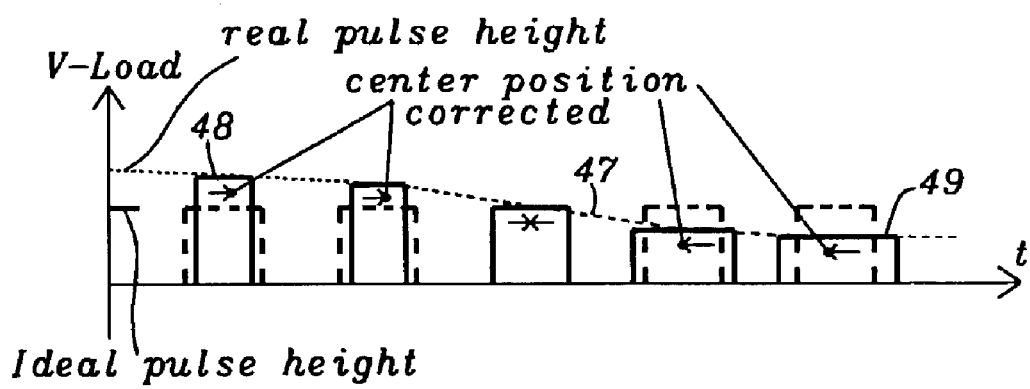

FIG. 4c shows the corrected pulses (45 and 46 of FIG. 4b), after their center is moved to the center-clock position 48 and 49.

Figure 5A:
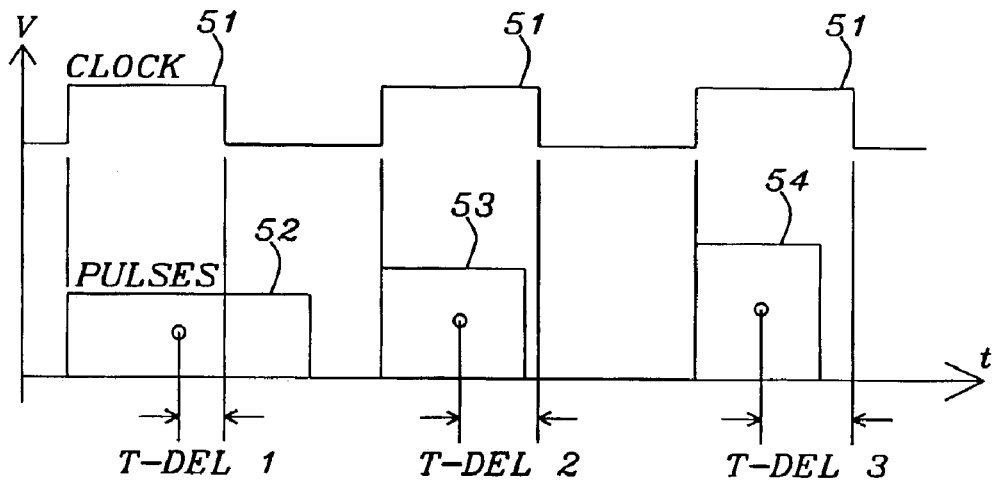
FIGS. 5a and 5b show the relationship of center position error and their correction.
Figure 5B:
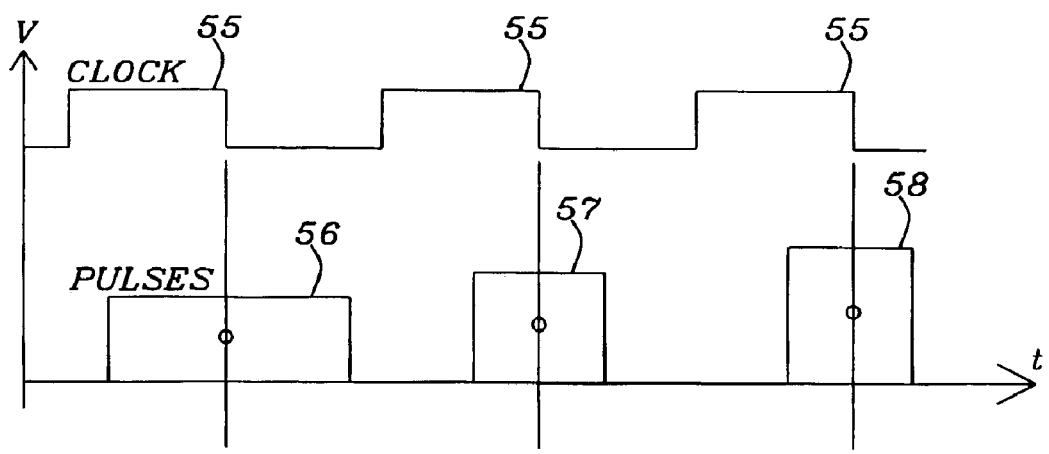

FIGS. 5a and 5b show the simplified relationship of center position error and their correction.

FIG. 5a show a typical situation with the pulses having different widths and where said pulses 52, 53 and 54 start at the clock start time, but where the centers of said pulses are not at the desired nominal clock position 51. Each center of said pulses 52, 53 and 54 deviates from the desired clock position by the time T-DEL1, T-DEL2 and T-DEL3.

FIG. 5b shows the pulses after center of gravity compensation is applied. The centers of said pulses are now at the desired nominal clock position 55. Each center of the pulses 56, 57 and 58 is moved to the desired clock position by the amount of T-DEL1, T-DEL2 and T-DEL3.

Figure 6:
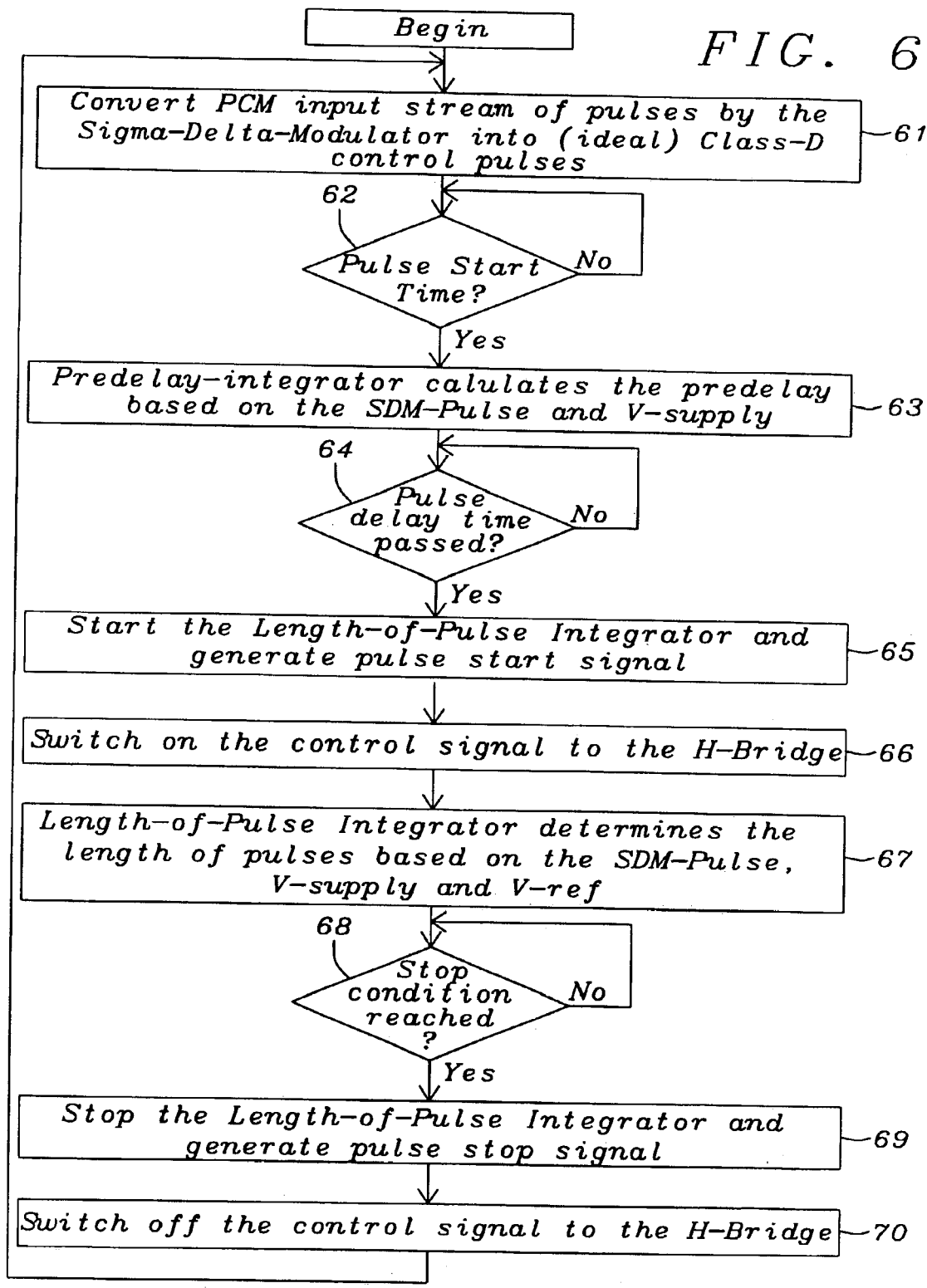
FIG. 6 shows a method for linearization of output pulses in a Class-D Amplifier.

The method to achieve the objectives of this invention is illustrated in FIG. 6.

First, the input signal is converted by the Sigma-Delta-Modulator into ideal PDM pulses (61). Now at pulse start time (62), said "Predelay-Integrator" calculates the predelay based on the SDM-Pulse and V-supply (63). After the pre-delay is passed (64), the "Length-of-Pulse Integrator" starts and generates the pulse start signal (65) and the control signal to the H-Bridge is switched on (66). Then in step (67) the Length-of-Pulse Integrator determines the length of pulses, based on the SDM-Pulse, V-supply and V-ref. As soon as the Stop condition reached (68) the Length-of-Pulse Integrator stops and generates the pulse stop signal (69) and the control signal to the H-Bridge is switched off (70).

While the invention has been particularly shown and described with reference to the preferred embodiments thereof, it will be understood by those skilled in the art that various changes in form and details may be made without departing from the spirit and scope of the invention.

What is claimed is:

1. A circuit to assure the center of each pulse for a Class-D Amplifier is always positioned at its nominal clock position or with a fixed delay relative to said nominal clock position, comprising:

means to convert the input signal into ideal, yet uncompensated PDM (Pulse Density Modulated) control pulses;

means to calculate the position of each individual pulse center;

means to determine the required delay to compensate the deviation of each of said individual pulse centers from their desired nominal pulse position;

means to generate the corrected power driver control pulses;

means for a power driver to drive voltage into an output load, controlled by said power driver control pulses; and means for an output load as the amplifier output's target.

2. The circuit of claim 1 wherein said input signal is an analog signal.

3. The circuit of claim 1 wherein said input signal is a digital signal with low sampling rate and high bit resolution.

4. The circuit of claim 1 wherein said means to convert the input signal into PDM (Pulse Density Modulated) control pulses is a Sigma Delta Modulator.

5. The circuit of claim 1 wherein said means for a power driver is an H-Bridge.

6. A circuit to compensate the pulse-center-misplacement in a time-voltage-area corrected Class-D Amplifier, comprising:

means to convert the input signal into ideal, yet uncompensated PDM (Pulse Density Modulated) control pulses;

means to correct the time-voltage-area, depending on a voltage representing the actual voltage across the output load means to define said value, representing the actual voltage across the output load;

means to define the output pulse area reference;

means to determine the delay for the power driver control pulses start point;

means to further generate the corrected power driver control pulses;

means for a power driver to drive voltage into an output load, controlled by said power driver control pulses; and means for an output load as the amplifier output's target.

7. The circuit of claim 6 wherein said input signal is an analog signal.

8. The circuit of claim 6 wherein said input signal is a digital signal with low sampling rate and high bit resolution.

9. The circuit of claim 6 wherein said means to convert the input signal into PDM (Pulse Density Modulated) control pulses is a Sigma Delta Modulator.

10. The circuit of claim 6 wherein said means for a power driver is an H-Bridge.

11. The circuit of claim 6 wherein said means to correct the time-voltage-area, depending on a voltage representing the actual voltage across the output load is implemented as an integrated digital logic function.

12. The circuit of claim 6 wherein said means to correct the time-voltage-area, depending on a voltage representing the actual voltage across the output load is implemented as a calculating algorithm in a digital signal processor.

13. The circuit of claim 6 wherein said means to determine the delay for the power driver control pulses start point comprises means to integrate said value, representing the actual voltage across the output load.

14. The circuit of claim 6 wherein said means to determine the delay for the power driver control pulses start point comprises means to calculate said delay out of said integrated value, representing the actual voltage across the output load, and of said output pulse area reference.

15. The circuit of claim 6 wherein said means to further determine the delay for the power driver control pulses start point is implemented as an integrated digital logic function.

16. The circuit of claim 6 wherein said means to further determine the delay for the power driver control pulses start point is implemented as a calculating algorithm in a digital signal processor.

17. The circuit of claim 6 wherein said means to further generate the corrected power driver control pulses is implemented as an integrated digital logic function.

18. The circuit of claim 6 wherein said means to further generate the corrected power driver control pulses is implemented as a calculating algorithm in a digital signal processor.

19. A circuit to assure the pulse-center in a multi-level Class-D Amplifier with various discrete time-voltage-area values is always positioned at the correct nominal clock position or with a fixed delay relative to said nominal clock position, comprising:

means to convert the input signal into PDM (Pulse Density Modulated) control pulses;

means to generate pulses with various discrete time-voltage-area values, depending on a pulse length control signal;

means to define said value, representing the actual voltage across the output load;

means to define the output pulse area reference;

means to determine the required delay to compensate the deviation of each of the individual pulse centers from their desired nominal pulse position, thus defining the power driver control pulse's start point;

means to further generate the corrected power driver control pulses;

means for a power driver to drive voltage into an output load, controlled by said power driver control pulses; and means for an output load as the amplifier output's target.

20. The circuit of claim 19 wherein said input signal is an analog signal.

21. The circuit of claim 19 wherein said input signal is a digital signal with low sampling rate and high bit resolution.

22. The circuit of claim 19 wherein said means to convert the input signal into PDM (Pulse Density Modulated) control pulses is a Sigma Delta Modulator.

23. The circuit of claim 19 wherein said means for a power driver is an H-Bridge.

24. The circuit of claim 19 wherein said means to generate pulses with various discrete time-voltage-area values, depending on a pulse length control signal is implemented as an integrated digital logic function.

25. The circuit of claim 19 wherein said means to generate pulses with various discrete time-voltage-area values, depending on a pulse length control signal is implemented as a calculating algorithm in a digital signal processor.

26. The circuit of claim 19 wherein said means to determine said required delay to compensate the deviation of each of said individual pulse centers from their desired nominal pulse position for the power driver control pulse's start point comprises means to integrate the pulse time.

27. The circuit of claim 19 wherein said means to determine said delay for the power driver control pulses start point comprises means to calculate said delay out of said integrated time value and of said output pulse area reference.

28. The circuit of claim 19 wherein said means to further determine the delay for the power driver control pulses start point is implemented as an integrated digital logic function.

29. The circuit of claim 19 wherein said means to further determine the delay for the power driver control pulses start point is implemented as a calculating algorithm in a digital signal processor.

30. The circuit of claim 19 wherein said means to further generate the corrected power driver control pulses is implemented as an integrated digital logic function.

31. The circuit of claim 19 wherein said means to further generate the corrected power driver control pulses is implemented as a calculating algorithm in a digital signal processor.

32. A method to assure the center of each output pulse of said Class-D Amplifier is always positioned at the nominal clock position or with a fixed delay relative to said nominal clock position, comprising:

providing means to convert said input signal into ideal, yet uncompensated PDM (Pulse Density Modulated) control pulses, means to correct the time-voltage-area, depending on a voltage representing the actual voltage across the output load, means to define said value, representing the actual voltage across the output load, means to determine the delay for the power driver control pulses start point, means to further generate the corrected power driver control pulses, means for a power driver to drive voltage into an output load, controlled by said power driver control pulses and means for an output load as the amplifier output's target;

converting said input signal into ideal, yet uncompensated PDM control pulses;

correcting the time-voltage-area, depending on a voltage representing the actual voltage across the output load;

defining a value representing the actual voltage across the output load determining the delay for the power driver control pulses start point;

further generating said corrected power driver control pulses;

applying said power driver control pulses to said power driver; and driving said power driver's output voltage to the output load (typically a loudspeaker).

33. The method of claim 32 wherein said input signal to convert is an analog signal.

34. The method of claim 32 wherein said input signal to convert is a digital signal with low sampling rate and high resolution.

35. The method of claim 32 wherein converting input signal into PDM control pulses is done by a Sigma Delta Modulator.

36. The method of claim 32 wherein an H-Bridge is used for driving voltage to the output load.

37. The method of claim 32 wherein the output pulse area reference is assumed to be of fixed and a priori known magnitude.

38. The method of claim 32 wherein defining the output pulse area reference is performed by an external reference control function.

39. The method of claim 32 wherein determining the delay for the power driver control pulses start point is performed by calculating said delay out of said integrated value, representing the actual voltage across the output load, and of said output pulse area reference.

40. The method of claim 32 wherein defining said output pulse area reference is done in an integrated digital logic function.

41. The method of claim 32 wherein defining said output pulse area reference is done in a calculating algorithm in a digital signal processor.

42. The method of claim 32 wherein further determining the delay for the power driver control pulses start point is performed in an integrated digital logic function.

43. The method of claim 32 wherein further determining the delay for the power driver control pulses start point is performed in a calculating algorithm in a digital signal processor.

44. The method of claim 32 wherein generating said corrected power driver control pulses is performed in an integrated digital logic function.

45. The method of claim 32 wherein generating said corrected power driver control pulses is performed in a calculating algorithm in a digital signal processor.

* * * * *